United States Patent [19]

Arai et al.

[11] Patent Number: 5,403,785
[45] Date of Patent: Apr. 4, 1995

[54] PROCESS OF FABRICATION IC CHIP PACKAGE FROM AN IC CHIP CARRIER SUBSTRATE AND A LEADFRAME AND THE IC CHIP PACKAGE FABRICATED THEREBY

[75] Inventors: Hitoshi Arai, Suzuka; Syuichi Furuichi, Yokkaicho; Toshiyuki Yamaguchi, Fuku; Takeshi Kanou, Yokkaichi; Tooru Higuchi, Yokkaichi; Muneo Yamada, Yokkaichi; Toshimasa Kitagawa, Yokkaichi; Takashi Sugimoto, Matsuzaka, all of Japan

[73] Assignee: Matsushita Electric Works, Ltd., Osaka, Japan

[21] Appl. No.: 63,059

[22] Filed: May 19, 1993

Related U.S. Application Data

[63] Continuation-in-part of Ser. No. 852,362, Mar. 13, 1992, abandoned.

[30] Foreign Application Priority Data

| Mar. 3, 1991 | [JP] | Japan | 3-050044 |
| Mar. 15, 1991 | [JP] | Japan | 3-050043 |
| Jul. 15, 1992 | [JP] | Japan | 4-187268 |
| Jan. 14, 1993 | [JP] | Japan | 5-004585 |
| Jan. 14, 1993 | [JP] | Japan | 5-004586 |

[51] Int. Cl.$^6$ .............................. H01L 21/60
[52] U.S. Cl. ...................... 437/220; 437/182; 437/206; 437/209; 437/217
[58] Field of Search ............ 437/220, 182, 221, 206, 437/210, 209, 217; 228/1.1, 179, 180.1, 180.2

[56] References Cited

U.S. PATENT DOCUMENTS

| 4,413,404 | 11/1983 | Burns | 437/206 |
| 4,776,509 | 10/1988 | Pitts et al. | 228/1.1 |
| 4,800,178 | 1/1989 | Mathew et al. | 437/220 |
| 4,994,412 | 2/1991 | Kalfus et al. | 437/220 |
| 5,001,545 | 3/1991 | Kalfus et al. | 437/220 |
| 5,040,293 | 8/1991 | Yamazaki et al. | 437/220 |

*Primary Examiner*—Brian E. Hearn
*Assistant Examiner*—Kevin M. Picardat
*Attorney, Agent, or Firm*—Nikaido, Marmelstein, Murray & Oram

[57] ABSTRACT

An IC chip package is fabricated from a substrate carrying an IC chip and formed with a conductive pattern of conductors for electrical connection to the IC chip, and a leadframe having a plurality of connector leads with inner and outer lead sites for electrical connection with associated ones of the conductors and with an external circuit, respectively. Fabrication of the IC chip package is made through the steps of placing the inner lead sites into intimate contact on distal ends of the corresponding conductors, and applying ultrasonic vibrations to contacting surfaces between the inner lead sites and the conductors so as to effect diffusion bonding therebetween. For applying the ultrasonic vibrations, a horn is pressed against the inner lead sites of the connector leads in such a manner as to leave indents in the inner lead sites which act to anchor an encapsulating plastic at the time of encapsulating the IC chip, the substrate, and most of the leadframe, for obtaining tight grip between the encapsulating plastic and the connector leads. At least one of the inner lead site and the distal end of the corresponding conductor may be provided with a suitable plating or bump for facilitating the diffusion bonding.

18 Claims, 9 Drawing Sheets

PROCESS OF FABRICATION IC CHIP PACKAGE FROM AN IC CHIP CARRIER SUBSTRATE AND A LEADFRAME AND THE IC CHIP PACKAGE FABRICATED THEREBY tion Ser. No. 07/852,362, filed Mar. 13, 1992, now abandoned.

1. Field of the Invention

The present invention is directed to a process of fabricating an IC chip package and an IC chip package fabricated from an IC chip carrier substrate and a leadframe.

2. Description of the Prior Art

In the art of IC chip package including of an IC chip carrier substrate mounted to a leadframe with connector leads, solder-joints are widely utilized for bonding between the connector leads and corresponding conductors on the substrate. The solder-joints, however, may sometimes cause problems in that the substrate suffers thermal deformation by the effect of heat applied at the time of soldering which deteriorate mechanical strength of the substrate and may even lower electrical isolation between the conductors of the substrate. The problems become more critical when the substrate is a resin laminate. Also, with the use of the solder, there is a potential hazard in that the solder itself may cause solder bridges or solder balls straddling over the adjacent conductors and that a flux contained in the solder may cause conduction failure. Thus, the solder-joint may jeopardize conduction reliability of the IC chip package at the connection between the leadframe and the conductor circuit on the substrate.

SUMMARY OF THE INVENTION

The above problems can be successfully eliminated in the present invention which provides a process of fabricating an IC chip package as well as the IC chip package fabricated thereby. The process utilizes a substrate carrying an IC chip and formed with a conductive pattern of conductors for electrical connection to the IC chip, and a leadframe having a plurality of connector leads with inner and outer lead sites for electrical connection with corresponding ones of the conductors and with an external circuit, respectively. The fabrication process comprises the steps of placing the inner lead sites into intimate contact on distal ends of the corresponding conductors, and applying ultrasonic vibrations to contacting surfaces between the inner lead sites and the conductors so as to effect diffusion bonding therebetween. Thus, the substrate can be mounted to the leadframe by solder-less bonds so that it can be free from undesired conduction failure and lowered mechanical strength of the substrate which are inherent to the solder-joints utilized in the prior art fabrication process. Heat may be applied at the same time of applying the ultrasonic vibrations for enhancing the diffusion bonding.

Accordingly, it is a primary object of the present invention to provide a unique process of fabricating an IC chip package which is capable of successfully bonding the substrate to the leadframe without using solder and therefore without causing undesired deterioration in electric characteristics as well as in mechanical strength of the substrate.

Preferably, at least one of the inner lead site and the opposed portion of the corresponding conductor may be coated with a suitable plating or bump. The plating or the bump may be of gold, silver, nickel, or the like metal for facilitating the diffusion bonding. When the inner lead sites and the opposed portions of the conductors are both coated with the platings or bumps for effecting the diffusion bonding therebetween, the plating or bumps may be of the same or different metals.

It is therefore another object of the present invention to provide a process of fabricating an IC chip package which is capable of achieving the solder-less bonding effectively between the substrate and the leadframe.

For applying the ultrasonic vibrations, a horn is pressed against the inner lead sites of the connector leads in such a manner as to leave indents in the inner lead sites. The resulting indents act to anchor an encapsulating plastic when encapsulating the IC chip, the substrate, and most of the leadframe, thereby obtaining tight bonds between the encapsulating plastic and the connector leads. The IC chip package thus encapsulated can provide an increased adhesion between the connector leads and the encapsulating plastic, thereby enabling to securely retain the connector leads partly within the encapsulating plastic while exposing the outer lead sites outwardly thereof. This is most advantageous in that the connector leads can be kept intact during a finishing process of cutting the connector leads apart from the leadframe and bending them into an array of terminal leads.

It is therefore a further object of the present invention to provide an IC chip package and a process of fabricating the same in which the connector leads can be tightly engaged with and retained by the encapsulating plastic so as to be securely supported thereby.

These and still other objects and advantageous features of the present invention will become more apparent from the following description of the preferred embodiment of the present invention when taken in conjunction with the attached drawings.

DETAILED DESCRIPTION OF THE EMBODIMENT

Figure 1:
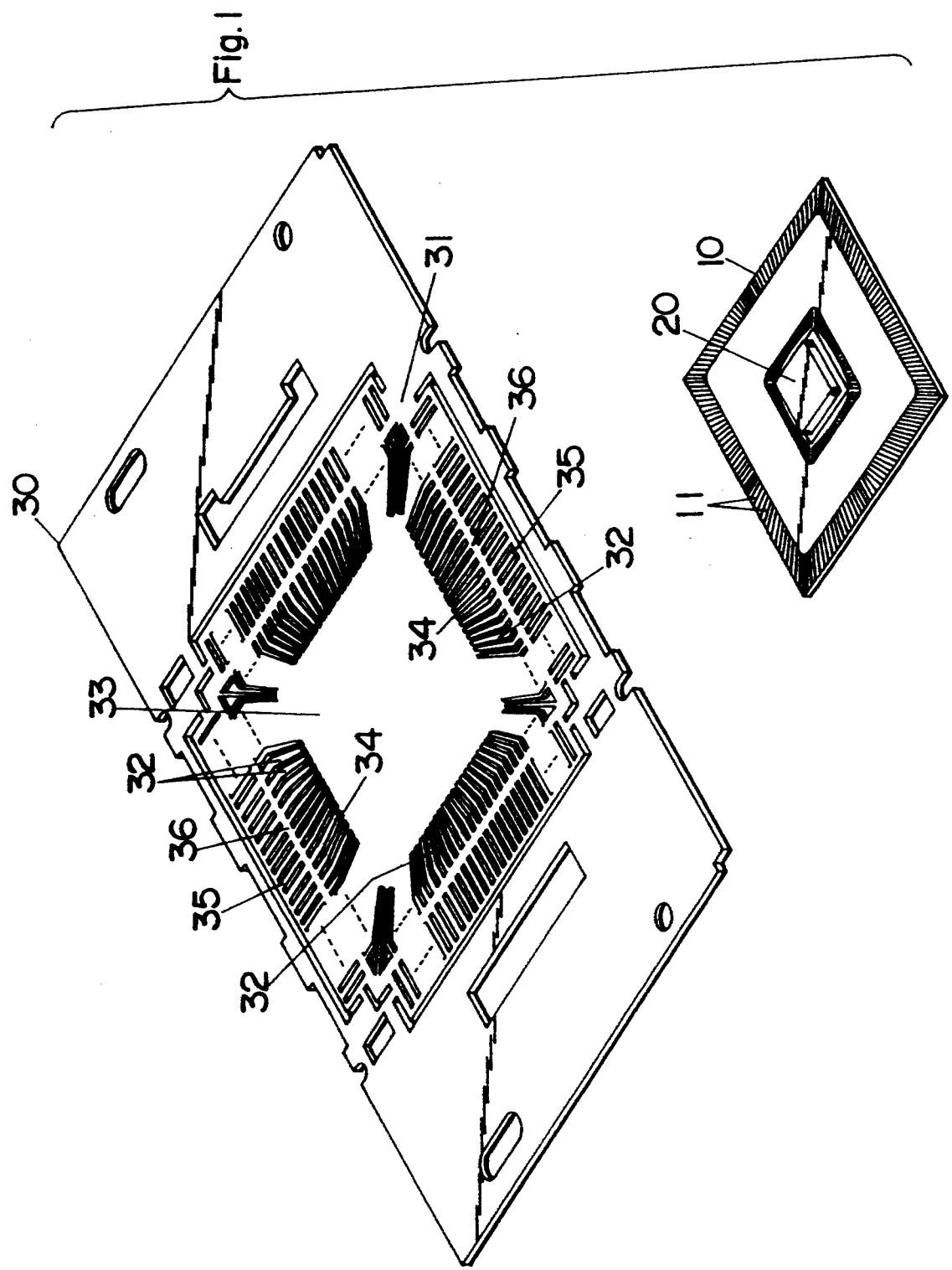
FIG. 1 is an exploded perspective view of an IC chip package composed of an IC chip carrier substrate bonded to a leadframe in accordance with a preferred embodiment of the present invention.
Figure 2:
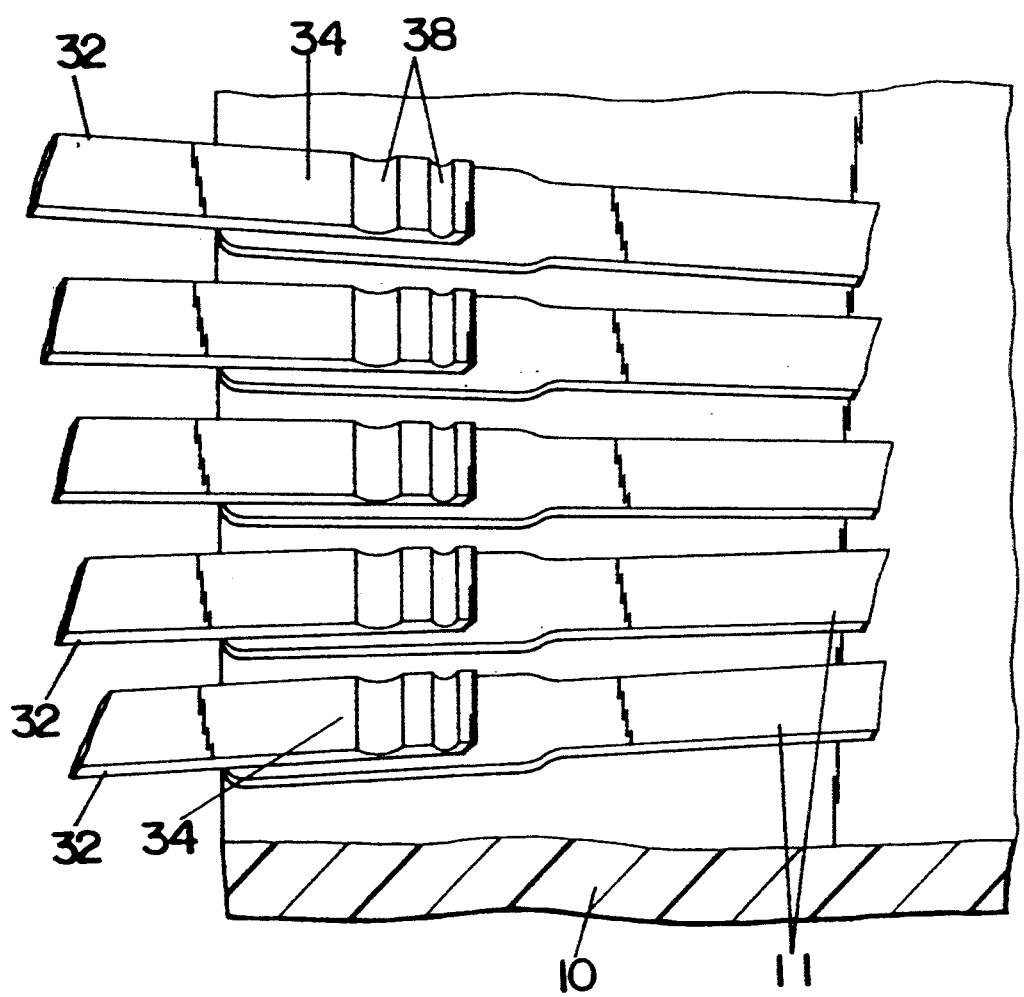
FIG. 2 is a partial view illustrating bonded portions between connector leads of the leadframe and corresponding end portions of conductors formed on the substrate.
Figure 3:
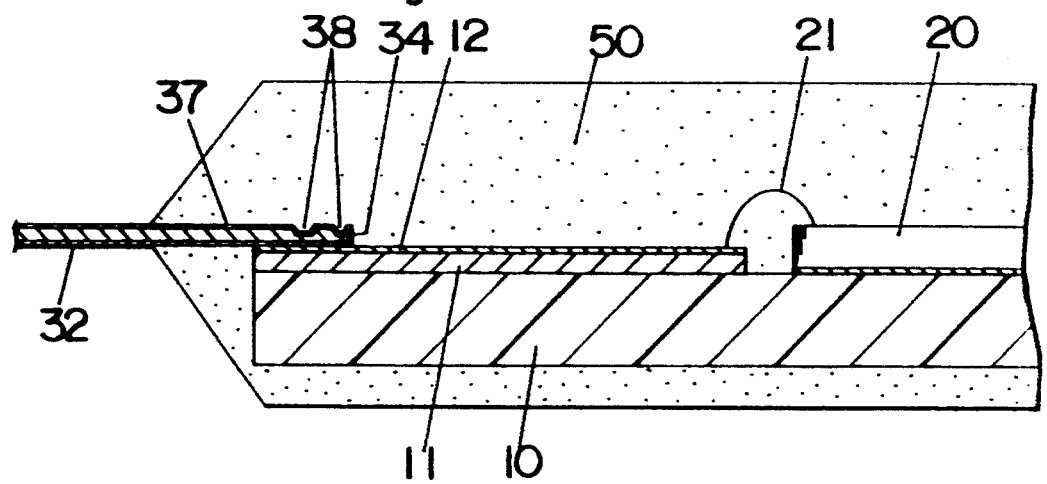
FIG. 3 is a partial sectional view of the IC chip package.

As shown in FIG. 1, an IC chip package fabricated in accordance with the present invention comprises a carrier substrate (which is hereinafter referred to simply as substrate) 10 mounted to a leadframe 30, one of repeating modules arranged in an array in a single layer tape of a conductive material, for example, aluminum, copper, steel, or suitable alloy having superior electrical conductivity. The substrate 10 carries an IC chip 20 on its top center and is formed on its top surface with a pattern of conductors 11 for electrical connection to pads of the IC chip 20 at the inner ends by means of wires 21, as shown in FIG. 3, and for connection to the leadframe 30 at the outer ends, in a manner as discussed hereinafter. The substrate 10 may be a laminate of glass-fiber reinforced epoxy, polyimide, fluororesin, polyphenylene, and the like, or a single layer of ceramic. The pattern of the conductors 11 may be copper or aluminum formed by being subtractively etched from a foil, electroplated, or screen-printed. The conductors 11 are preferably coated with a suitable plating 12 of gold, silver, nickel or the like.

The leadframe 30 is configured to have an outer rectangular frame 31 with a patterns of connector leads 32 which fan inwardly from four sides of the frame 31 to define an opening 33 in the center of the frame 31. Each of the connector leads 32 is a 0.1 to 0.5 mm width and 0.05 to 0.5 mm thick strip which has an inner lead site 34 for bonding to a corresponding one of the conductors 11 on the substrate 10 and an outer lead site 35 which define an external lead for connection with an external circuit. The connector leads 32 are interconnected by a web 36 which is finally cut for separating the individual connector leads from each other. The inner lead site 34 is preferably coated with a plating 37 of gold, silver, nickel or the like.

Figure 4:
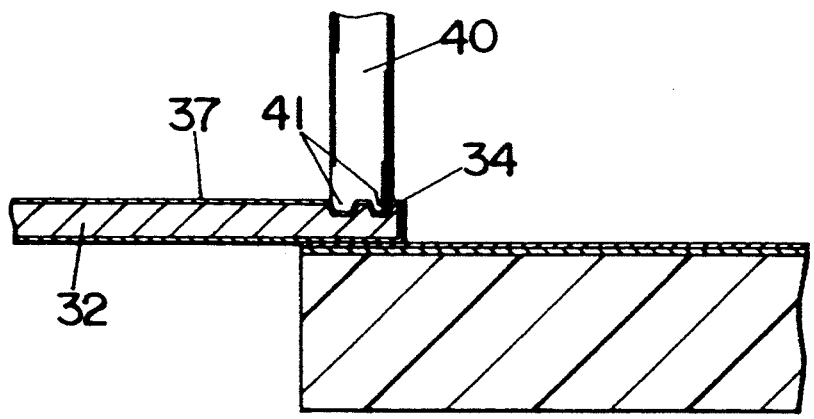
FIGS. 4 and 5 are explanatory views illustrating a manner of applying ultrasonic vibrations to the connection between the connector leads and the corresponding conductors on the substrate.
Figure 5:
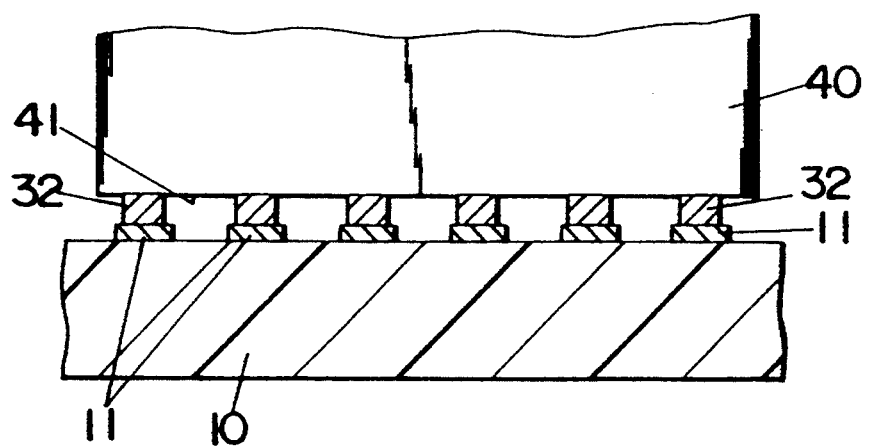

The leadframe 30 is positioned relative to the substrate 10 in such a manner as to overlap the inner lead sites 34 on the outer ends of the corresponding conductors 11 on the substrate 10. Then, a horn 40 is lowered to press the inner lead sites 34 by embosses 41 against the connectors 32, as shown in FIGS. 4 and 5, forcibly to such an extent to leave indents 38 in the inner lead sites 34. At this condition, the horn 40 is driven to apply ultrasonic vibrations to the connection for effecting diffusion bonding between the connector leads 32 and the corresponding conductors 11 at the interface. Thus, the substrate 10 is bonded to the leadframe 30 for establishing electrical connections between the conductors 11 and the connector leads 32. Thereafter, the substrate 10, the IC chip 20, and most of the leadframe 30 are encapsulated by a suitable encapsulant 50, such as epoxy resin, to present a molded IC chip package in the form of, for example, a quad flatpack with gull-wing leads. The ultrasonic vibrations are selected to be 50 to 120 kHz, preferably 55 to 115 kHz. The pressing force of the horn 40 is selected to be 200 to 500 g when the inner lead site 34 is of 0.2 mm width and 0.15 mm thick with the horn 40 having a pressing end face of 0.15×0.15 mm.

Figure 6:
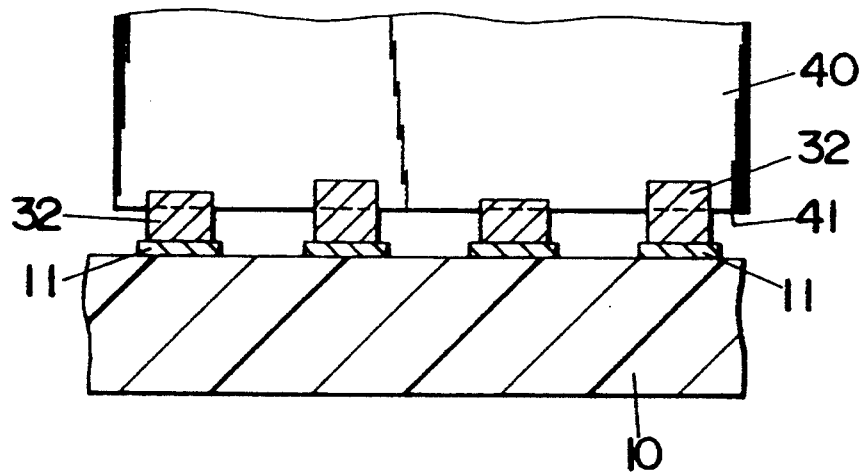
FIG. 6 is an explanatory view, similar to FIG. 5, for illustrating the bonding between the connector leads of varying thickness and the conductors on the substrate.
Figure 7:
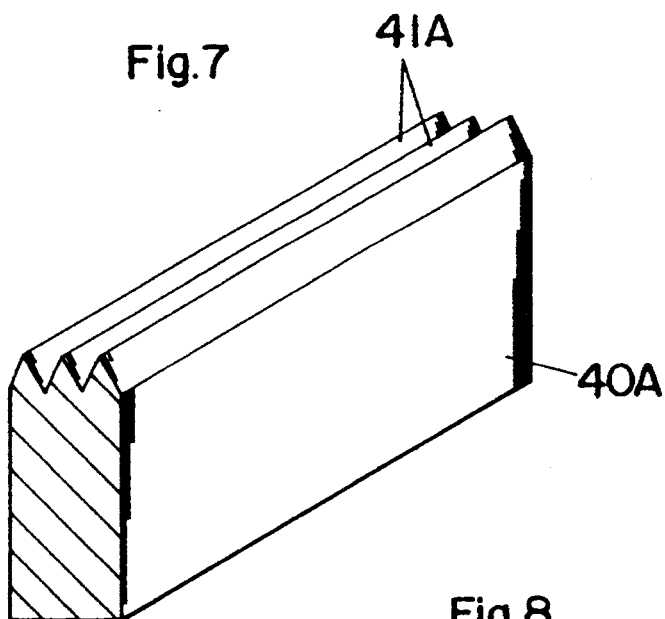
FIGS. 7 and 8 are respectively schematic views illustrating horns with embosses utilized for applying the ultrasonic vibrations to the connector leads and the conductors.
Figure 8:
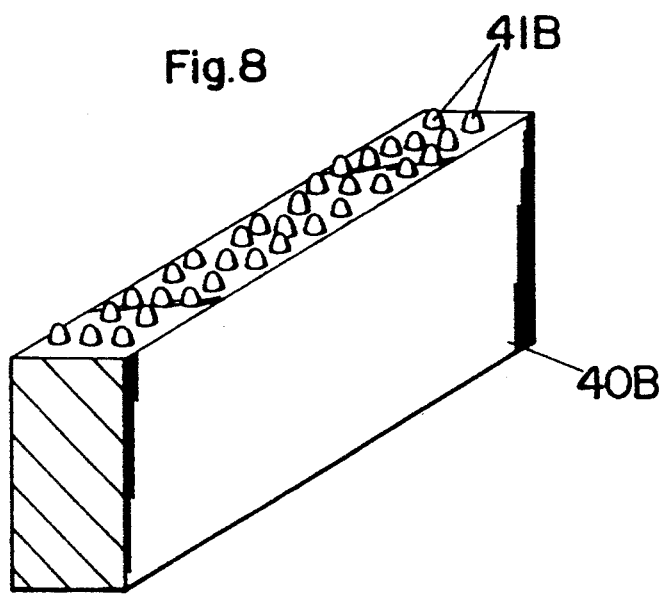

Although not seen in the figures, the horn 40 is configured to have a rectangular lower end so as to press all of the inner lead sites 34 against the corresponding conductors 11 at a time for effecting simultaneous bonding between the connector leads 32 and the conductors 11. Thus, the substrate 10 can be bonded at a time to the leadframe 30. It should be noted in this connection that this technique of pressing the inner lead sites 34 by the horn 40 can compensate for possible variations in the height or thickness of the inner lead sites 34, as shown in FIG. 6, for obtaining reliable bonding of the substrate 10 to the leadframe 30. The indents 38 left in the inner lead sites 34 act to engage into the encapsulant 50 for tightly and stably holding the connector leads 32 also to the encapsulant 50, thereby achieving a strain relief thereat to keep the connector leads 32 intact from external forces as applied in a finishing step of cutting the connector leads 32 from the leadframe 30 and bending them into final configurations, and therefore protecting the connector leads 32 from being accidentally detached from the conductors 11 during that step. The indents 38 may be of various shapes such as formed by the use of alternate horns 40A and 40B with embosses 41A and 41B of different configurations, as shown in FIGS. 7 and 8.

Figure 9:
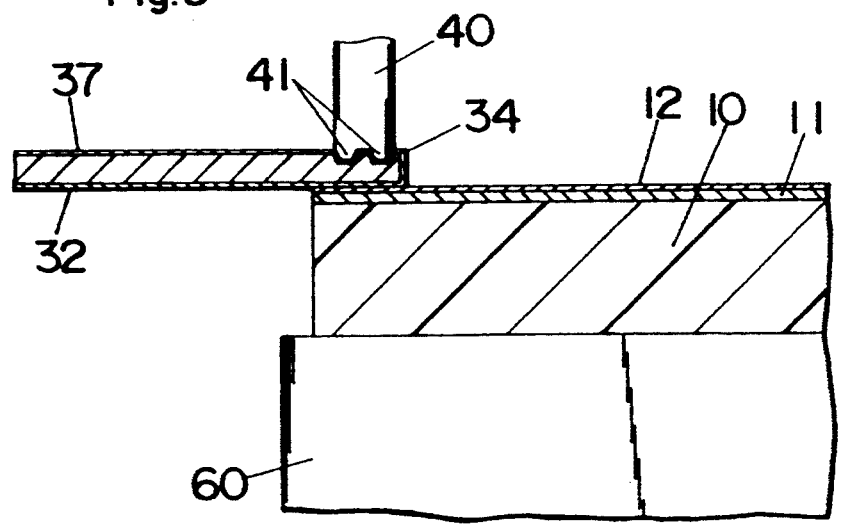
FIGS. 9 to 11 are partial views respectively illustrating the bonded portions between the connector leads and corresponding end portions of conductors in accordance with modifications of the above embodiment.

Heat may be utilized during the application of the ultrasonic vibrations for facilitating the diffusion bonding. To this end, a heater plate 60 is utilized to support thereon the substrate 10, as shown in FIG. 9, for heating the substrate 10 to a temperature of 130° to 300° C.

Figure 10:
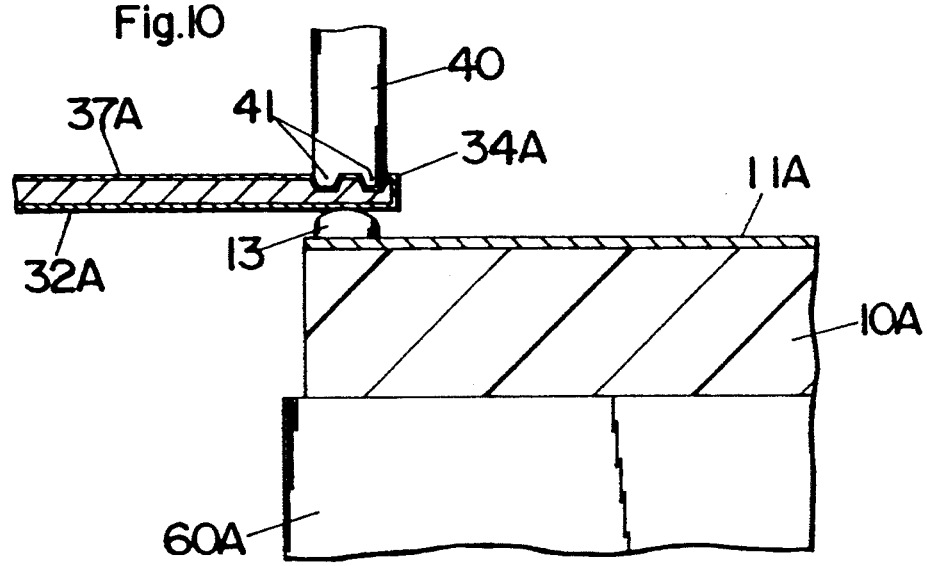

FIG. 10 illustrates a modification of the above embodiment in which a ceramic substrate 10A has a pattern of conductors 11A each formed at its outer end with a gold bump 13 for bonding to a corresponding connector lead 32A of a like leadframe. The connector lead 32A is coated with a gold plating 37A at its inner lead site 34A. The substrate 10A is placed upon a heater plate 60A for effecting the diffusion bonding between the plating 37A and the bump 13 by ultrasonic vibrations in the presence of heat applied thereto.

Figure 11:
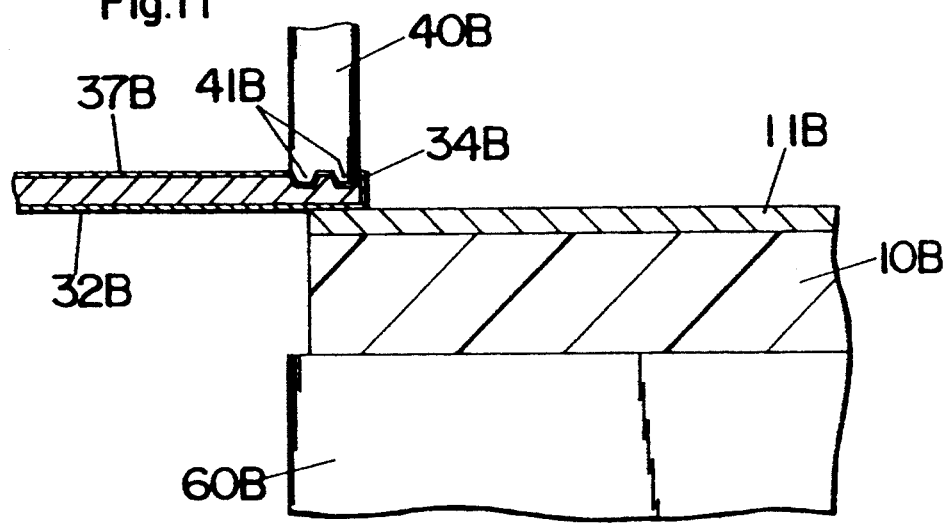
Figure 12:
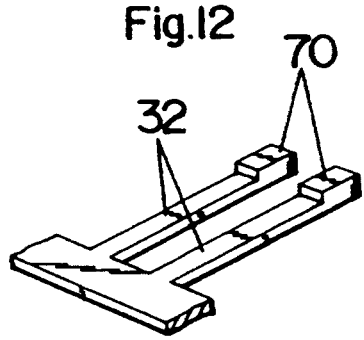
FIGS. 12 to 15 are perspective views of the connector leads of different configurations which may be utilized in the present invention.
Figure 14:
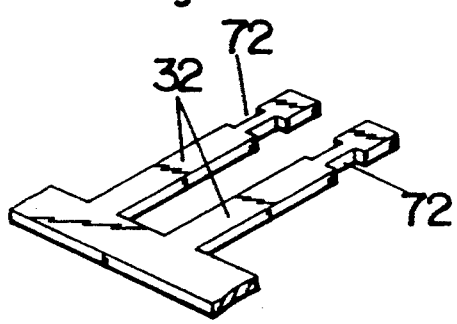
Figure 13:
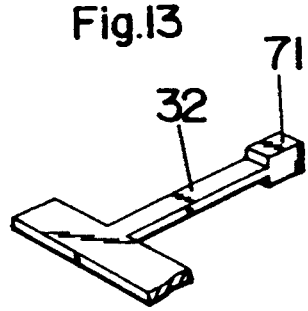
Figure 15:
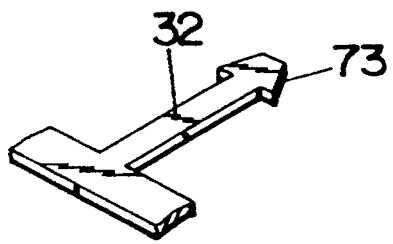

FIG. 11 illustrate another modification of the above embodiment in which a substrate 10B of epoxy laminate is bonded to a like leadframe made of 42-alloy and provided with connector leads 32B of which inner lead sites 34B are coated with gold platings 37B. The substrate 10B has a pattern of conductors 11B which are directly bonded to the gold platings 37B of the inner lead sites 34B by the diffusion bonding in the like manner as discussed with reference to the previous embodiment and modification.

As described in the above, the diffusion bonding can be obtained successfully between the inner lead site and the corresponding conductor directly or through platings or bumps. Although not to be taken in a limited sense, an optimum diffusion bonding is expected for a metal combination of aluminum-to-aluminum or aluminum-to-gold when the ultrasonic vibrations are applied in the absence of the heat, and for a metal combination of copper-to-gold when the ultrasonic vibrations are applied in association with the heat.

In order to examine bonding strength of the diffusion bonding between the connector leads and the conductors obtained in the embodiment and modifications of FIGS. 4 and 9 to 11, peel tests were made to the bonded overlapping portion extending over 1 mm length between the connector lead of 0.2 mm width and 0.15 mm thick to the conductor of a width greater than the connector lead. The result is that a pull force of as much as 500 to 1000 g is required to peel off the connector lead from the conductor, which demonstrates that the diffusion bonding assures a strong bonding equal to that obtained by the solder-joint and is therefore practically acceptable. Also, it is confirmed that the diffusion bonding is not collapsed even when the bonded portion is immersed into a soldering bath or heated to a soldering temperature, which is not expected in the solder-joint and confirms that the diffusion bonding can have a superior heat-resistance.

In addition to the engagement of the indents 38 in the connector leads 32 and the encapsulant, the connector leads may be configured to additionally include anchoring projections 70 and 71, notches 72, and barbs 73, as shown respectively in FIGS. 12 to 16, for enhancing the engagement with the encapsulant.

Figure 22:
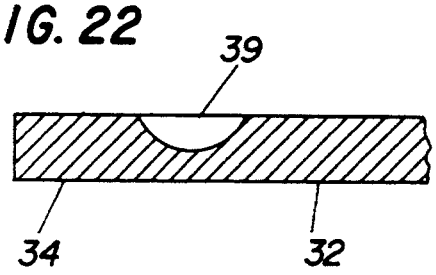
Figure 23:
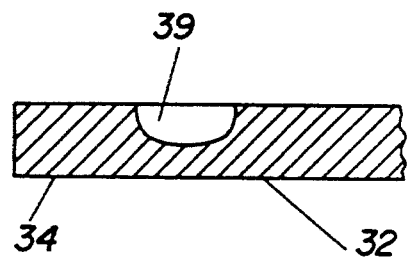
Figure 24:
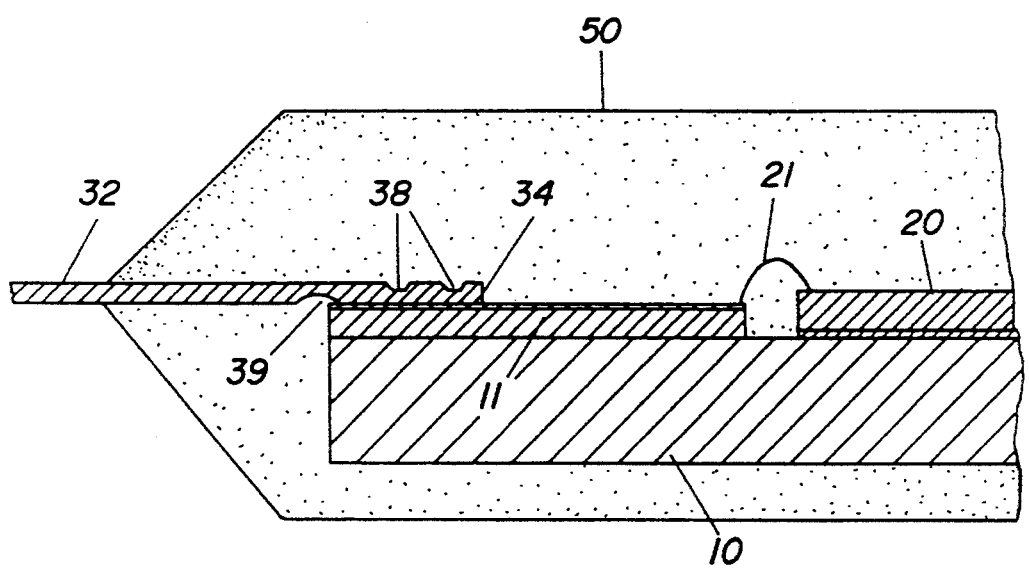
FIG. 24 is a view of a connector lead disposed within an encapsulating plastic.

FIGS. 16–24 illustrate various shapes of recesses 39 formed in connector lead 32 adjacent the inner lead site 34 but offset therefrom toward an outer lead site 35. The recess 39 is also used to anchor the encapsulating plastic as shown in FIG. 24. The modified shapes of the recesses in FIGS. 22 and 23 avoid lowering the mechanical strength of the recesses 39 by leaving the bottom of the recesses 39 rounded rather than at sharp angles.

Figure 16:
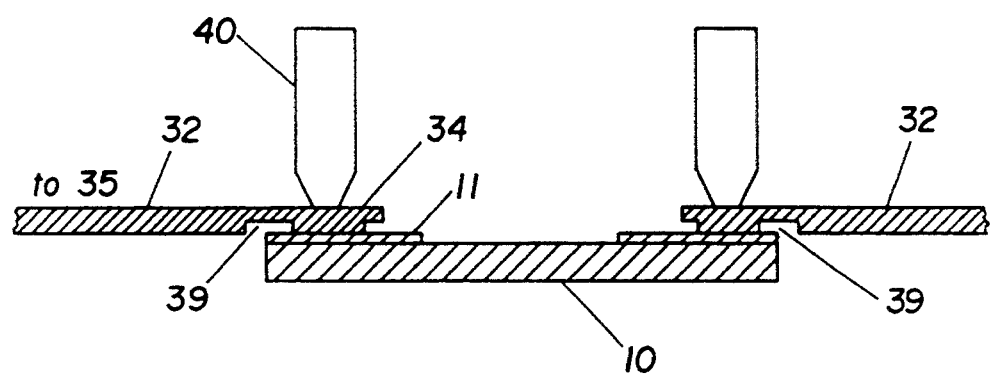
FIGS. 16 to 23 are views of connector leads having recesses.
Figure 17:
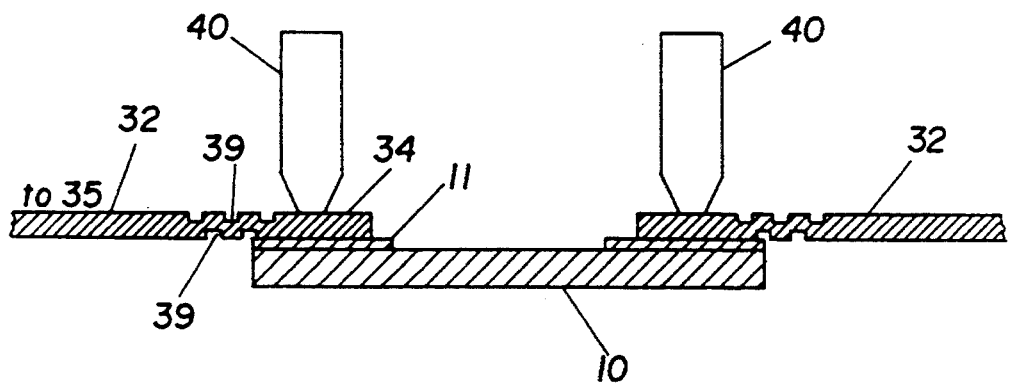
Figure 18:
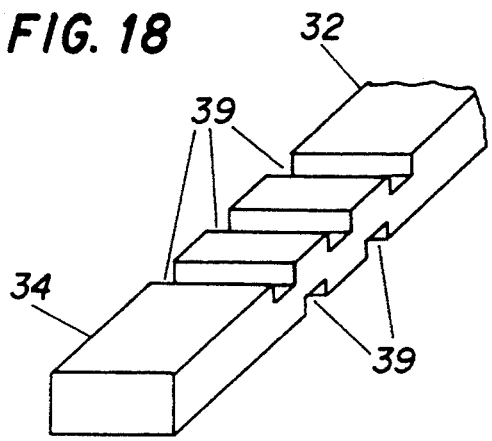
Figure 19:
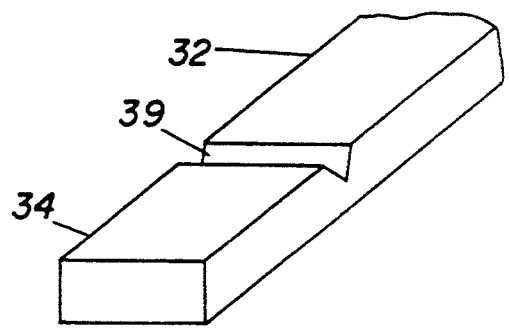

In particular, FIGS. 16 and 17 show connector leads 32 of the leadframe 30 formed with at least one recess 39. The recess 39 prevents ultrasonic energy, which is applied to the inner lead site 34, from dispersing toward the outer lead site 35 in order to effect concentration of the ultrasonic energy on the inner lead site 34. To this end, the recess 39 is provided in the connector lead 32 at a portion adjacent to the inner lead site 34 in a spaced relation therefrom toward the outer lead site 35. The recess 39 is also utilized to anchor an encapsulating plastic similar to the indent 38.

FIG. 16 shows connector leads with one recess 39 while FIG. 17 shows connector leads with plural recesses. FIGS. 18 through 23 disclose a number of modified shapes of the recesses 39. Recesses 39 of FIGS. 18 and 19 may be modified to have rounded or U-shaped bottoms as shown in FIGS. 22 and 23.

Figure 20:
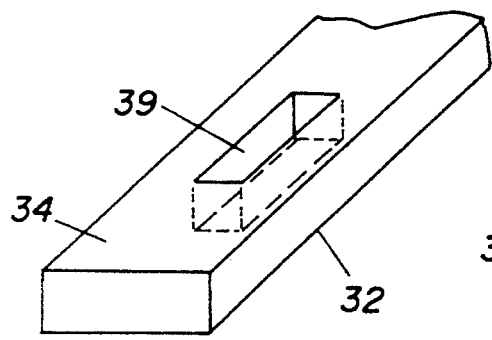

FIG. 20 shows a connector lead 32 having a recess in the form of a through-hole. In particular, the recess 39 is in the form of a rectangular through-hole which is elongated along the length of the connector lead.

Figure 21:
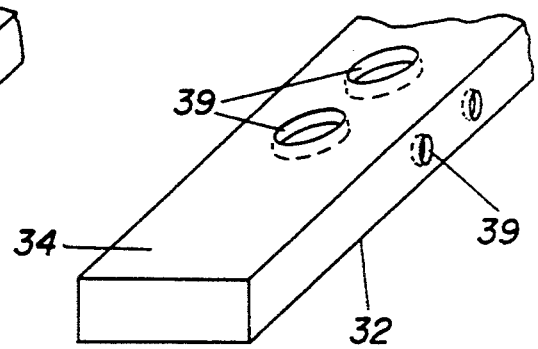

FIG. 21 shows a connector lead 32 having a plurality of recesses 39. In particular, the recesses 39 are in the form of a circular configuration. The circular configuration of FIG. 21 may have a rounded or U-shaped bottom as shown in FIGS. 22 and 23. The recesses 39 of FIG. 21 are aligned along the length of the connector lead 32. Furthermore, as shown in FIGS. 21, recesses 39 are formed in at least two faces of the connector lead 32.

The recesses of FIGS. 20 and 21 are effective in reducing the possibility of a crack occurring at the recess when the connector lead 32 is required to be bent for mounting. Therefore, the connector lead 32 retains sufficient mechanical strength in spite of the presence of the recess 39. The shapes of the recesses shown in FIGS. 16–23 are not limited to the shapes illustrated, but may be any shape which concentrates ultrasonic energy in the inner lead site and prevents the ultrasonic energy from dispersing toward the outer lead site.

FIG. 24 shows a recess 39 disposed within an encapsulating plastic 50. Due to the presence of the recess 39 within the encapsulating plastic 50, the recess 39 is cooperative with the indent 38 to prolong a creeping distance at the interface between the plastic and the connector lead 32, thereby effectively preventing moisture from entering inside the encapsulated package to improve moisture resistance. In addition, the recess 39 gives an additional anchoring effect of firmly gripping the encapsulating plastic 50 also at the recess 39 in addition to the indent 38. As shown in FIG. 24, the recess 39 is located inside of the encapsulating plastic 50, but has at least a portion thereof offset outwardly from the conductor 11 to effectively prevent entry of moisture to the conductor 11 on the substrate 10.

From the foregoing description of the preferred embodiment of the invention, it will be apparent that many modifications may be made therein. It should be understood that these embodiments are intended as one example of the invention only, and that the invention is not limited thereto. Therefore, it should be understood that the appended claims are intended to cover all modifications that fall within the true spirit and scope of the invention.

What is claimed is:

1. A process of fabricating an IC chip package from a substrate carrying an IC chip and formed with a conductive pattern of conductors for electrical connection to said IC chip, and a leadframe having a plurality of connector leads with inner and outer lead sites for electrical connection with associated ones of said conductors and with an external circuit, respectively, said process comprising the steps of:
   placing said inner lead sites into intimate contact on distal ends of the corresponding conductors;
   forming at least one indent in each of said inner lead sites by Dressing inner lead sites against distal ends of said conductors; and
   applying ultrasonic vibrations to contacting surfaces between all said inner lead sites and all said conductors to effect diffusion bonding therebetween.

2. A process as set forth in claim 1, wherein at least one of said inner lead site and the distal end of the corresponding conductor is coated with metal plating responsible for said diffusion bonding.

3. A process as set forth in claim 1, wherein said inner lead sites and said distal ends of said conductors are coated with platings between which said diffusion bonding occurs.

4. A process as set forth in claim 1, wherein said inner lead sites and said distal ends of said conductors are coated with platings of different metals between which said diffusion bonding occurs.

5. A process as set forth in claim 1, wherein said inner lead sites are coated with platings which are bonded by said diffusion bonding to bumps formed on the corresponding conductors.

6. A process as set forth in claim 1, wherein heat is applied to said contacting surfaces at the same time of applying said ultrasonic vibrations.

7. A process of fabricating an IC chip package from a substrate carrying an IC chip and formed with a conductive pattern of conductors for electrical connection to said IC chip, and a leadframe having a number of connector leads with inner and outer lead sites for electrical connection with associated ones of said conductors and with an external circuit, respectively, said process comprising the steps of:
   placing said inner lead sites on distal ends of the corresponding conductors;
   forming at least one indent in each of said inner lead sites by pressing said inner sites against the distant ends of said conductors by means of a horn;

applying ultrasonic vibrations to contacting surfaces between said inner lead sites and said conductors to effect diffusion bonding therebetween; and encapsulating said substrate, said IC chip, and most of said leadframe in an encapsulating plastic while leaving only said outer lead sites to project outwardly from the encapsulating plastic to allow the encapsulating plastic to engage into said indents in said connector leads wherein said indents causing a tight grip between said encapsulating plastic and said connector leads.

8. A process as set forth in claim 7, wherein said horn is pressed against the distal ends of all of the connector leads for effecting said diffusion bonding simultaneously between said connector leads and said conductors.

9. A process as set forth in claim 7 further comprising the step of forming said connector lead with at least one recess for preventing ultrasonic energy, which is applied to an inner lead site, from dispersing toward an outer lead site to concentrate the ultrasonic energy at the inner lead site.

10. A process as claimed in claim 9 wherein said at least one recess is formed at a portion adjacent to the inner lead site in a spaced relation therefrom toward an outer lead site.

11. A process as claimed in claim 9 wherein said at least one recess anchoring said encapsulating plastic and said connector leads in addition to anchoring by said indents.

12. A process as claimed in claim 9 wherein said at least one recess is in a form of a through-hole.

13. A process as set forth in claim 9 wherein said at least one recess is in a form of a rectangular through-hole and elongated along a length of the connector lead.

14. A process as set forth in claim 9 wherein said at least one recess is in the form of a circular configuration.

15. A process as set forth in claim 9 wherein said at least one recess is in formed in a circular configuration and has a rounded bottom.

16. A process as set forth in claim 9 wherein at least two recesses are aligned along a length of said connector lead.

17. A process as set forth in claim 9 wherein said at least one recess is located inside of said encapsulating plastic and has at least a portion of said recess offset outward from the conductor to effectively prevent entry of moisture into the conductor on the substrate.

18. A process as set forth in claim 7 wherein said connector lead is formed in at least two faces thereof with recesses.

* * * * *

UNITED STATES PATENT AND TRADEMARK OFFICE
CERTIFICATE OF CORRECTION

PATENT NO. : 5,403,785
DATED : April 4, 1995
INVENTOR(S) : ARAI et al.

It is certified that error appears in the above-indentified patent and that said Letters Patent is hereby corrected as shown below:

On the title page item [30], line 1, delete

"Mar. 3, 1991" and substitute therefor --Mar. 15, 1991--.

Signed and Sealed this

Thirty-first Day of October 1995

Attest:

BRUCE LEHMAN

*Attesting Officer*  *Commissioner of Patents and Trademarks*